United States Patent [19]
Somayajula

[11] Patent Number: 5,497,122
[45] Date of Patent: Mar. 5, 1996

[54] LOW POWER CLASS-AB INTEGRATED CIRCUIT AMPLIFIER

[75] Inventor: Shyam S. Somayajula, Austin, Tex.

[73] Assignee: Crystal Semiconductor, Austin, Tex.

[21] Appl. No.: 377,529

[22] Filed: Jan. 20, 1995

[51] Int. Cl.$^6$ ...................................................... H03F 3/45
[52] U.S. Cl. ......................... 330/253; 330/255; 330/311
[58] Field of Search ................................. 330/146, 253, 330/255, 263, 264, 269, 311

[56] References Cited

U.S. PATENT DOCUMENTS

| | | | |
|---|---|---|---|
| 4,988,954 | 1/1991 | Stern et al. | 330/264 |
| 5,177,450 | 1/1993 | Lee et al. | 330/253 |
| 5,212,455 | 5/1993 | Pernici et al. | 330/253 |
| 5,239,210 | 8/1993 | Scott | 307/355 |
| 5,281,924 | 1/1994 | Maloberti et al. | 330/253 |
| 5,285,168 | 2/1994 | Tomatsu et al. | 330/253 |

FOREIGN PATENT DOCUMENTS

| | | | |
|---|---|---|---|
| 161009 | 7/1986 | Japan | 330/253 |
| 253706 | 10/1988 | Japan | 330/253 |

OTHER PUBLICATIONS

Eynde, Frank N. L.; Ampe, Patrick F. M.; Verdeyen, Lode; and Sansen, Willy M.C., "A CMOS Large-Swing Low-Distortion Three-Stage Class AB Power Amplifier", *IEEE Journal of Solid-State Circuits*, vol. 25, Feb. 1990.

Stern, Kenneth J.; Sooch, Nav S.; Knapp, David J.; Nix, Michael A. "A Monolithic Line Interface Circuit for T1 Terminals", *IEEE International Solid-State Circuits Conference*, pp. 292–293, 1987.

Gray, Paul R. and Meyer, Robert G., "Analysis and Design of Analog Integrated Circuits" *John Wiley & Sons*, p. 753, 1984.

Hein, Jerrell P. and Starke, Richard J., "A Single-Chip Digital Signaling Interface for the DSI Intraoffice Environment", *IEEE International Solid-State Circuits Conference*, pp. 148–149, 1989.

Tsividis, Yannis, "Design of Mos VlSI Circuits for Telecommunications" *Prentice-Hall, Inc.* pp. 560–561, 1985.

Hogervorst, Ron; Tero, John P.; Eschauzier, Ruud, G. H.; and Hujsing, Johan H., "A Compact Power-Efficient 3V CMOS Rail-to-Rail Input/Output Operational Amplifier for VLSI Cell Libraries", *IEEE International Solid-State Circuits Conference*, pp. 244–245, 1994.

*Primary Examiner*—James B. Mullins
*Attorney, Agent, or Firm*—Arnold, White & Durkee

[57] ABSTRACT

An amplifier circuit having four variable impedance nodes is provided. The amplifier has split transconductance current paths. Each half of the amplifier has two such current paths and each current path has a node which may be either a high impedance or low impedance node. Connected between the two nodes is a transistor which is utilized in driving the nodes to their either high or low impedance state. The invention is particularly useful in a folded cascode amplifier used for driving loud speakers. However, the circuitry may also be used in other amplifiers or other applications.

20 Claims, 10 Drawing Sheets

LOW POWER CLASS-AB INTEGRATED CIRCUIT AMPLIFIER

BACKGROUND OF THE INVENTION

This invention relates to amplifier circuits and more particularly to integrated circuit amplifiers having a dual transconductance current path.

The required characteristics and features of integrated circuit amplifiers are evolving as new uses for integrated circuit amplifiers develop. One such use is in a new generation of portable electronic products such as the personal digital assistant (PDA), digital cellular phones, etc. that utilize a speaker phone feature, thus requiring a loud speaker. The smaller the impedance rating of the speaker, the louder it sounds for a given voltage drop across it. Since most of these portable products run off low power supplies (2.7 v–5 v), the voltage drop across the speaker is limited. Hence, low impedance speakers (4 to 32 ohms) are used to produce sounds of reasonable loudness out of them. These electronic products use integrated circuits to perform the signal processing and to interface with the external components such as speakers, microphones, etc.

In order to deliver such large power into the speaker, the integrated circuits that interface with this speaker require a power amplifier capable of delivering the necessary current into the speaker for the desired voltage drop across it. As the output of the amplifier is connected to the speaker, the sound is modulated according to the input to the amplifier. To generate large currents, the amplifier should have an output stage with very large transistor devices (generally current doubles with twice the device size). The use of large devices requires much silicon area and dc power (the power when driving 0 volts across the speaker) both of which are undesirable requirements. In addition to the loudness, the amplifier design also controls the sound quality of the speaker. Thus, the amplifier should be carefully designed not only to minimize the silicon area and the dc power consumption, but also to be linear so as to produce reasonable sound quality out of the speaker. Unfortunately, linearity generally degrades with low available dc power.

Class-AB amplifier design is a design methodology which gives the designer control over the dc power consumption of the driver. A side effect of this design philosophy is that the designer also gets control over the linearity of the amplifier, which generally degrades with low available dc power. Hence, the design of a suitable class-AB amplifier is non-trivial and challenging because it is desirable to optimize good sound quality, low power consumption, and low silicon consumption.

SUMMARY OF INVENTION

The present invention is utilized in amplifier circuits. The invention includes an amplifier having dual transconductance current paths. Each current path has a node which, depending upon the operation conditions of the amplifier, may be a high impedance node or a low impedance node. At any given time, one node may be at a high impedance state while the other node is at a low impedance state. High impedance nodes provide large gate drives to the output devices hence the size of the output devices can be reduced. Connected between each of the impedance nodes is a transistor which aids in driving the nodes to the desired impedance state.

The present invention is particularly useful for use as an amplifier associated with a loud speaker. In such an embodiment, the impedance nodes of the amplifier are coupled to the gates of large output devices which are used to drive the speaker. The output devices are part of a class AB driven output stage.

In one embodiment, the present invention may be used in a folded cascode amplifier circuit. In such an embodiment, the folded current path of half of the amplifier circuit may include dual current paths. Each current path has a node which may be either a high or low impedance node. A transistor is connected between the two nodes for driving the nodes to the desired state.

The use of dual amplifier current paths having a transistor connected between a node of each current path for driving the nodes to either a high or a low impedance state is not limited to a folded cascode amplifier. For example, the invention may also be utilized with a non-folded cascode amplifier, other class AB amplifiers or amplifier other designs in which a dual transconductive current path is utilized.

DETAILED DESCRIPTION

In one embodiment of the present invention, a folded cascode class-AB amplifier design is utilized. The folded current path of the amplifier has dual current paths where at any given time, only one current path is a high gain path to the output stage and the other current path is a low gain, or no gain, path to the output stage. A transistor is connected between each current path and is utilized to switch the high impedance node from one current path to the other.

The amplifier design balances the requirements of low dc power consumption, minimum silicon area, and reasonable linearity, thus providing an amplifier that is particularly suited for portable speaker applications. However, the amplifier of the present invention is not limited to speaker applications and may be used in other applications when the characteristics of the amplifier of the present invention are desired such as dc motors, transformers, LCD displays, etc. Moreover, the present invention is not limited to folded cascode amplifiers, but rather, the present invention may be utilized in other class-AB amplifiers. Though the present invention operates in a class AB mode, it can be used in circuits which are essentially class A but might need bursts of additional power under particular input conditions which are few and far between. That is, the proposed amplifier can also be used as an add on booster for class A circuits. A detailed hierarchical description of the present invention follows.

Figure 1:
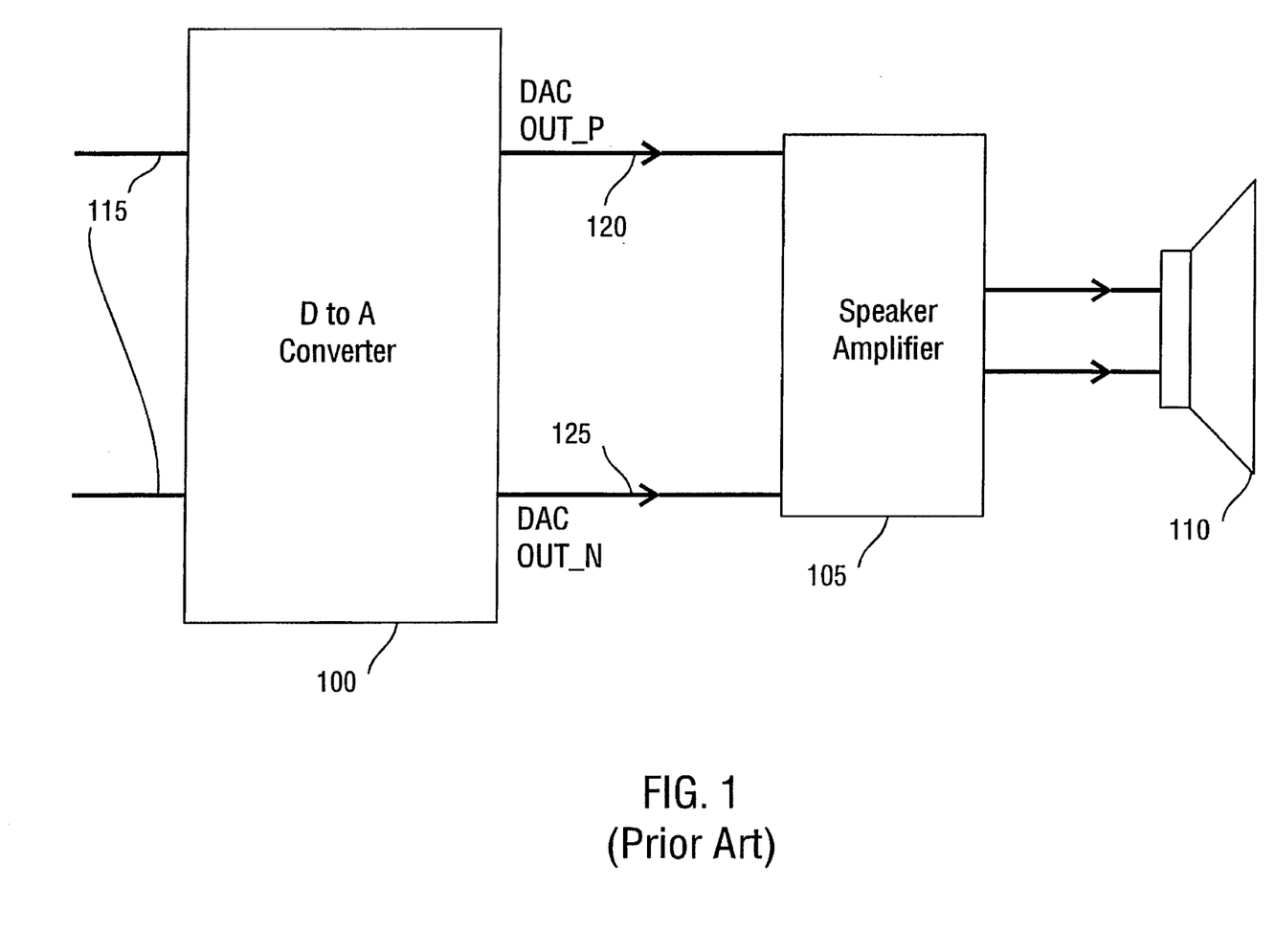
FIG. 1 illustrates the operating environment in which the present invention may be utilized.

A block diagram of a typical speaker application utilizing an amplifier is shown in FIG. 1. Block 100 is a digital to analog converter (DAC) and block 105 is a speaker amplifier, both of which may be part of a single integrated circuit. The speaker amplifier 105 may be an amplifier according to the present invention as described below. FIG. 1 also shows a speaker 110 which is external to the integrated circuit and is driven by the speaker amplifier 105. The digital to analog converter 100 receives a digital bit stream 115 as input and generates differential analog outputs 120 and 125 (DAC out_p and DAC out_n respectively) which are out of phase with each other (e.g. if DAC out_p goes up, DAC out_n goes down and vice versa). Both blocks 100 and 105 may amplify or attenuate the input signal.

Figure 2:
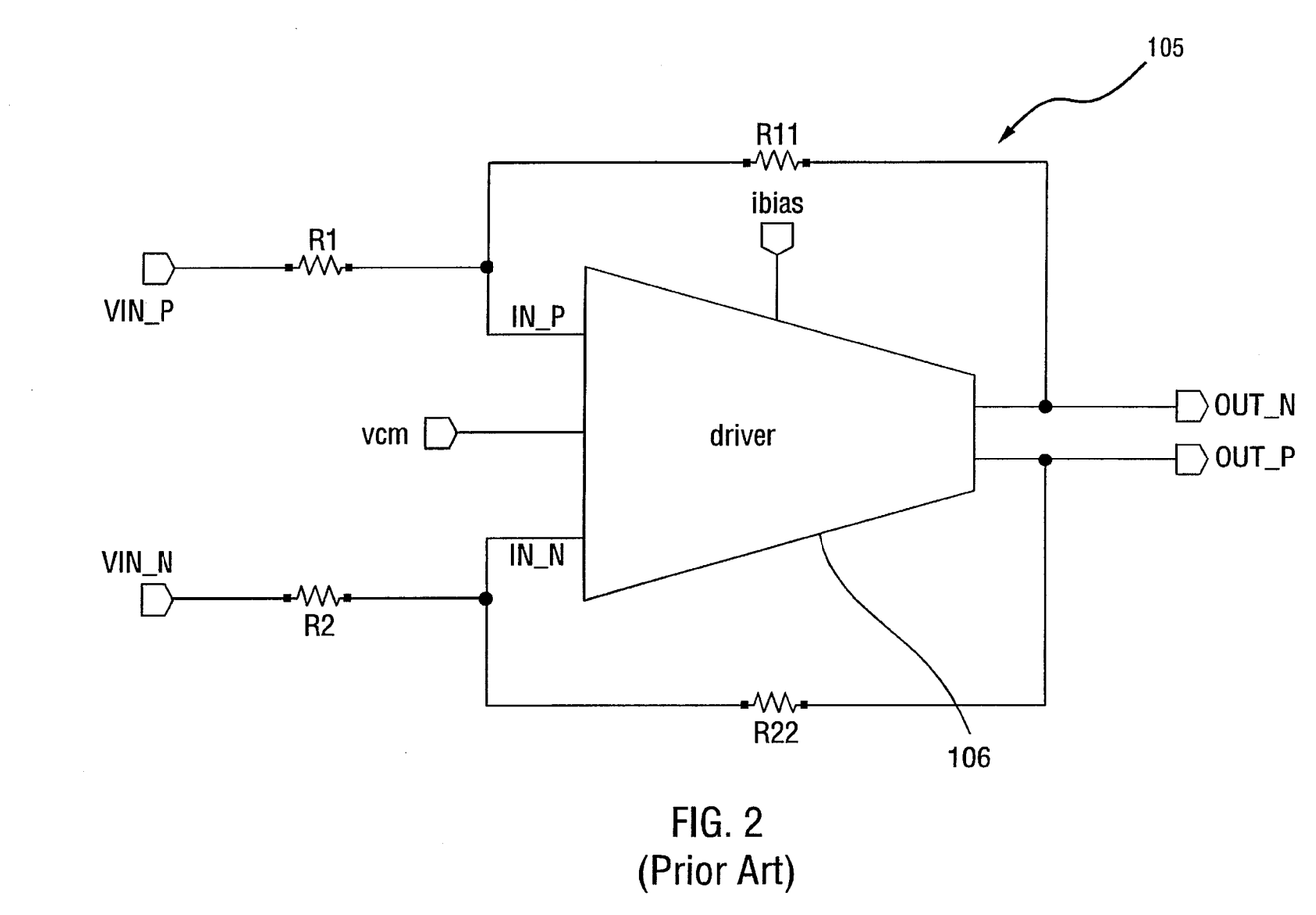
FIG. 2 illustrates a typical design of a speaker amplifier.

FIG. 2 shows an overview of a typical design of the speaker amplifier block 105 of FIG. 1. The resistors R1 and R11 determine the gain (R11/R1) from the input VIN_P to the output OUT_N. Similarly, the resistors R2 and R22 determine the gain (R22/R2) from VIN_N to OUT_P. The amplifier circuit also receives other inputs such as vcm and bias from other sections of the integrated circuit. These inputs are used to bias the transistors in the amplifier such that the transistors are in the proper region of operation and receive other control signals.

Figure 3:
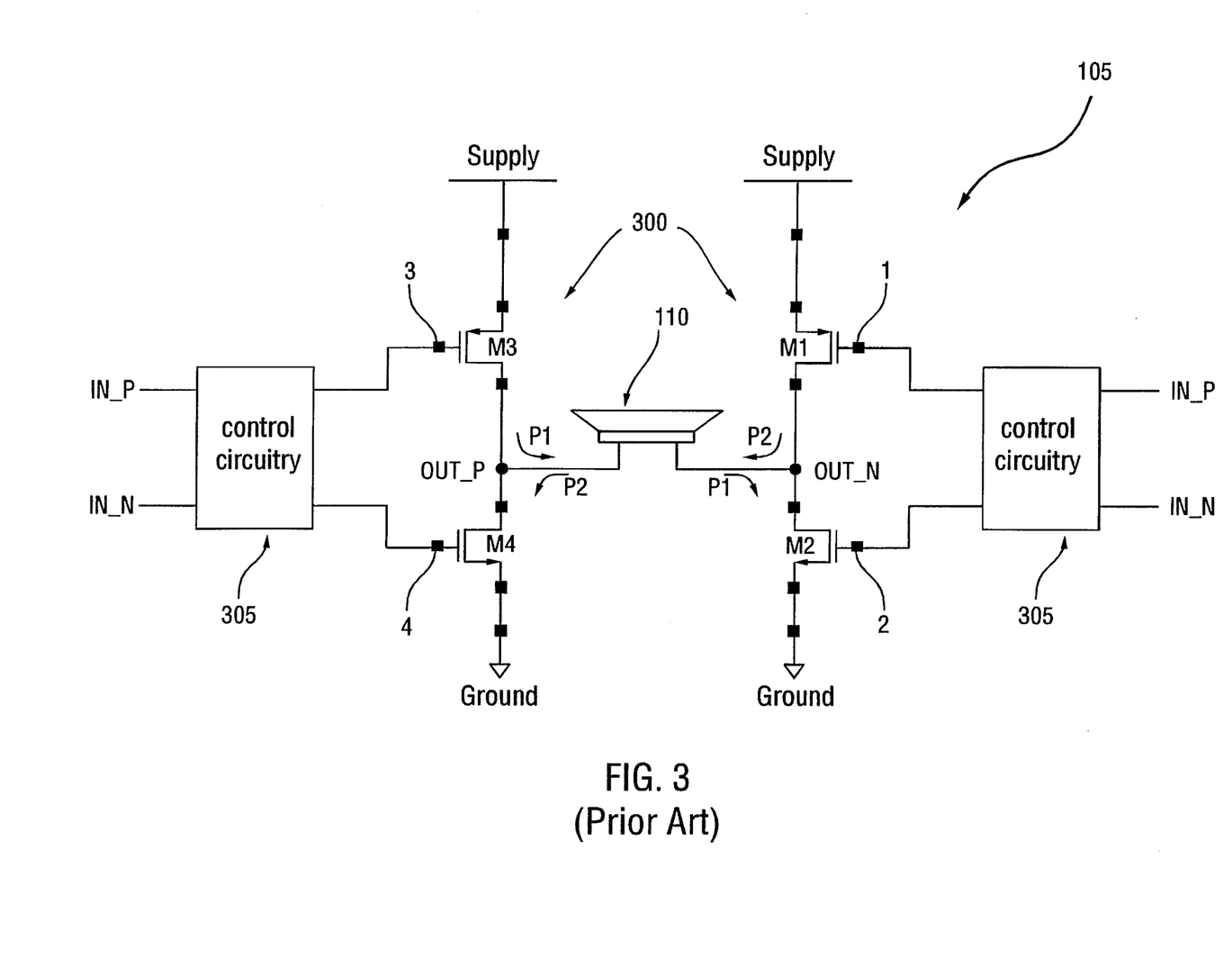
FIG. 3 illustrates a common source output stage configuration for a amplifier of FIG. 1.
Figure 4:
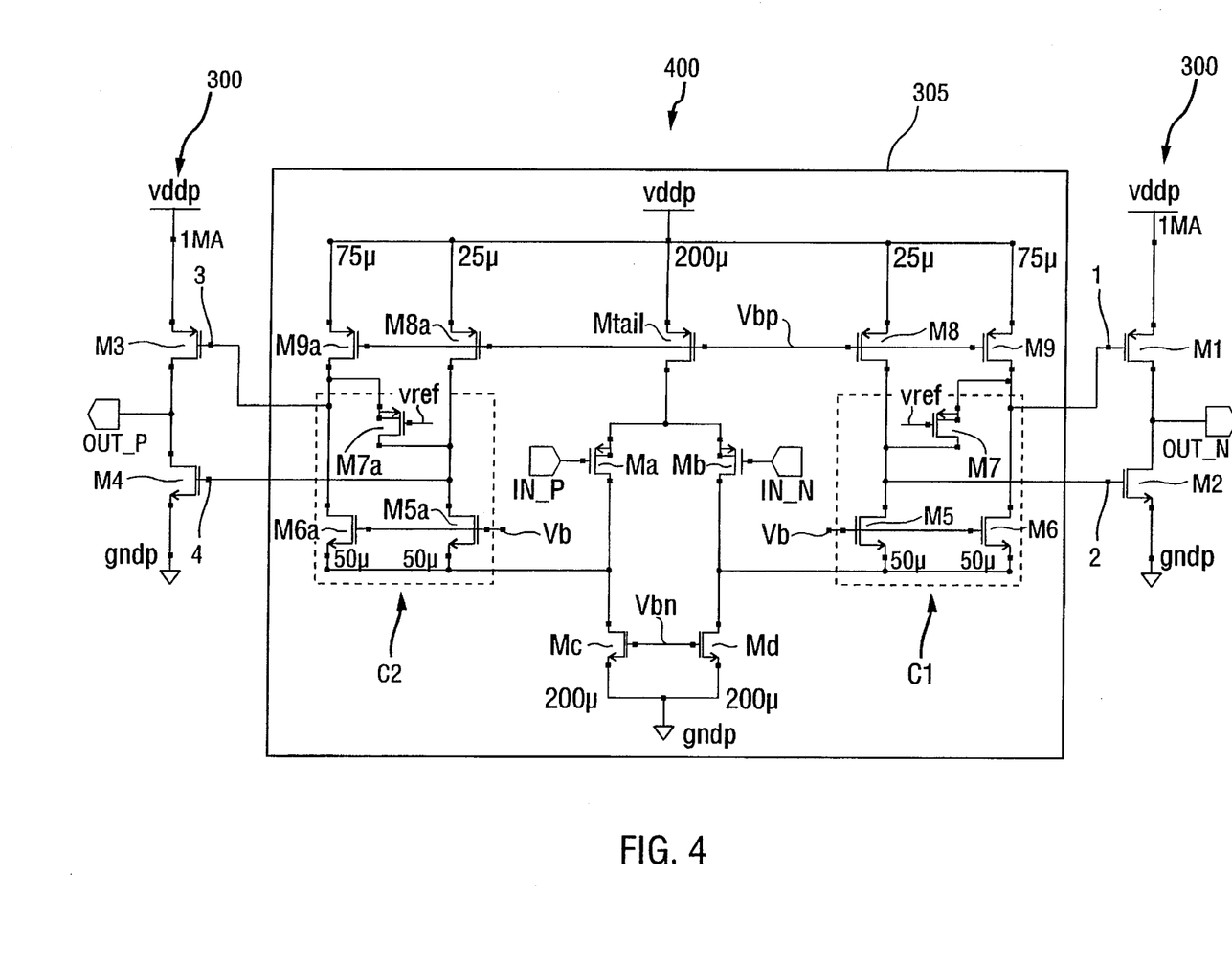
FIG. 4 illustrates an amplifier circuit according to the present invention.

FIG. 3 illustrates one design approach for the driver 106 of FIG. 2 to drive the speaker 110. The driver 106 uses two output stages 300 having a common source configuration of the output devices where the drain of the PMOS devices, M1 and M3, are connected to the drain of the NMOS devices, M2 and M4 of the same leg as shown in FIG. 3. The remaining portions of the driver 106 are shown as control circuitry block 305. Though shown as two blocks 305 in FIG. 3 for convenience, it will be recognized that C1, and C2 in FIG. 4 are identical and can be viewed as two instances of the same control circuitry having an in_p input, and in_n input and two output nodes.

To drive the signal in one direction through the speaker, the control circuitry in the driver should generate the proper gate voltages to the devices M1 and M4 such that the current flows from device M1, through the speaker, and into the device M4 (path P2 in FIG. 3). The signal can be driven in the opposite direction through the speaker by generating proper gate voltages of M3 and M2 such that the required current flows along the path P1. Note that the actual current through the speaker, at any instance of time, is a difference between the currents flowing in either paths and to maximize the power into the speaker, the current through the path opposite the desired path should be kept at a minimum. Thus, when current in the P2 path is desired, it is desirable to minimize the current in transistors M2 and M3. Likewise, when current in the P1 path is desired, it is desirable to minimize the current in transistors M1 and M4. To generate the large current desired for driving the speaker, the sizes of the output devices M1–M4 should be large (about 100–200 times larger than a typical device in the integrated circuit). Because current through a device may be given by the equation:

$$I=B*(W/L)*(Vg-Vs-Vt)^2,$$

the current through the output devices in FIG. 3 can be increased by increasing the gate voltage to the devices (of course the maximum gate voltage is limited by the supply voltage and the capability of the control circuitry which may malfunction even before the supply voltage is reached depending on its design).

The present invention recognizes that improved performance may be achieved by utilizing high impedance nodes (nodes which can have very high voltage swings on them) in the control circuitry to maximize the gate drive to drive the output devices. It can be seen that two high impedance nodes are needed in the control circuitry to drive both the PMOS and NMOS devices. The independent drive capability also gives control over setting the dc power consumption of the driver. Thus in an application such as shown in FIG. 3, the present invention utilizes amplifier control circuitry which provides a high impedance at the nodes which correspond to the output transistors in the desired speaker current path while providing a low impedance at the nodes which correspond to the output transistors in the undesired speaker current path. Further, the high gain nodes and low gain nodes may be switched back and forth depending on whether current path P1 or P2 is desired.

FIG. 4 illustrates the use of the present invention in a folded cascode amplifier embodiment for an application as shown in FIG. 3. The control circuitry 305 from FIG. 3 is shown within block 305 of FIG. 4. The amplifier 400 of FIG. 4 is a fully differential folded cascode amplifier modified to create additional high impedance nodes. The output devices M1–M4 may be considered as part of the amplifier, however, an amplifier of the present invention is not limited to the output device arrangement of FIG. 4.

As shown in FIG. 4, amplifier 400 has two differential inputs, Vin_P and Vin_N. Furthermore, the output nodes OUT_N and OUT_P are provided between the output devices M1 and M2 and between output devices M3 and M4 respectively. The gates of output devices M1, M2, M3, and M4 are connected to nodes 1, 2, 3, and 4 respectively.

Two differential input transistors Ma and Mb are provided having their sources connected together and tied to the drain of transistor Mtail. The gates of transistors Ma and Mb are connected to the inputs Vin_P and Vin_N respectively. The gate of transistor Mtail is connected to a bias voltage and the source is connected to the power supply, vddp, such that the transistor acts as a current source in that it supplies the tail to the input differential, transistors Ma and Mb. The drains of the differential input transistors Ma and Mb are connected to the drains of transistors Mc and Md respectively. The transistors Mc and Md have their sources connect together to the ground node gndp. The gates of transistors of Mc and Md are also tied together. The gates of Mc and Md are connected to a bias voltage source such that they can link the currents coming from Ma, M5a and M6a and from Mb, M5 and M6 respectively. Connected to transistors Mtail, Ma, Mb, Mc, and Md are two symmetrical sets of cascodeal transistors. The first set of transistors controls nodes 1 and 2 and comprises transistors M5, M6, M7, M8, and M9. The second set of transistors controls nodes 3 and 4 and comprises transistors M5a, M6a, M7a, M8a, and M9a. Because these two sets of transistors comprise symmetrical halves of the amplifier, the operation and structure of the amplifier will only be discussed with respect to the right half of the circuitry that includes transistors M5–M8. It will be recognized from the figures, however, that the left half of the circuitry operates in a similar manner.

Transistors M5 and M6 have their sources tied together and connected to the node that the drains of transistors Mb and transistors Md are also connected to. The gates of transistors M5 and M6 are connected together to a bias voltage Vb. The drain of transistor M5 is connected to the drain of transistor M8 and the drain of transistor M6 is connected to the drain of transistor M9. The sources of transistors M8 and M9 are connected to the voltage supply vddp. The gates of transistors M8 and M9 are tied together and tied to the gate of transistor Mtail. Thus, as shown in FIG. 4, a transconductance current path exists from the drain of transistor Mb through transistors M5, M6, M8 and M9. Further, this current path is a dual transconductance current path having two current branches, one branch having transistors M5 and M8 and the other branch having transistors M6 and M9. The dual transconductance current path shown in FIG. 4 is a particular type of dual transconductance current path in that the path is a split transconductance current path since the current branches are split from the same node (the drain of transistor Mb in this case). As shown with respect to FIG. 7, however, not all dual transconductance paths need be split transconductance paths.

The node that the drains of transistors M5 and M8 are connected to is node 2 and the node that the drains of transistors M6 and M9 are connected to is node 1. Transistor M7 is connected between node I and node 2. The drain of transistor M7 is connected to node 2 while the source of transistor M7 is connected to node 1. Thus, transistor M7 connects the two transconductive current branches. The voltage on the gate of transistor M7 is Vref.

As shown in FIG. 4, transistors Mtail, Ma, Mb, M7, M8, M9, and M1 are PMOS devices and transistors Mc, Md, M5, M6, and M2 are NMOS devices. However, it will be recognized that the present invention is not limited to the specific NMOS and PMOS selection shown in FIG. 4 and a designer may alter which transistors are NMOS devices and which transistors are PMOS devices.

Figure 5A:
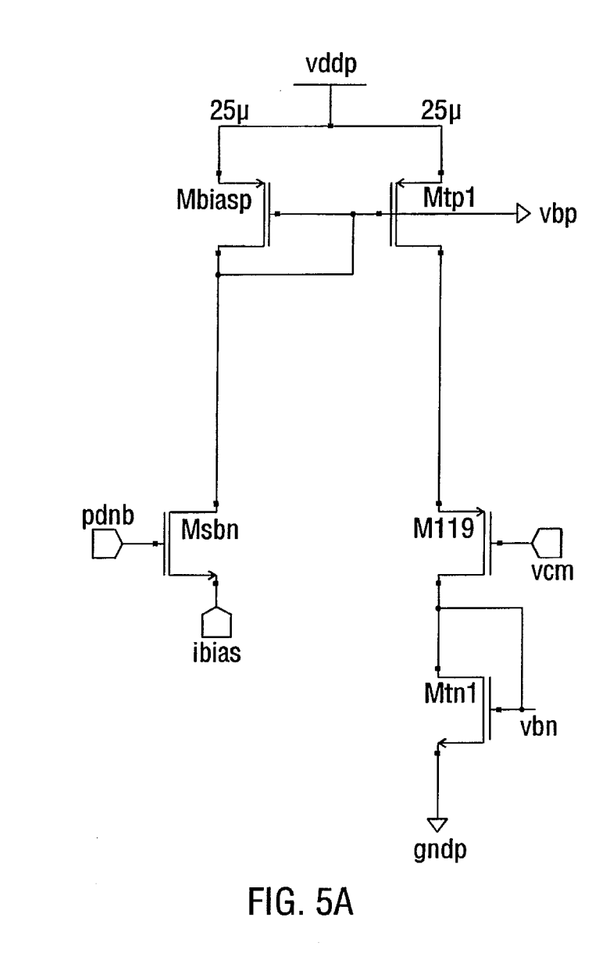
FIG. 5(a), FIG. 5(b), FIG. 5(c), FIG. 5(d), FIG. 5(e), and FIG. 5(f) illustrates possible biasing circuits for the amplifier circuit of FIG. 4.
Figure 5B:
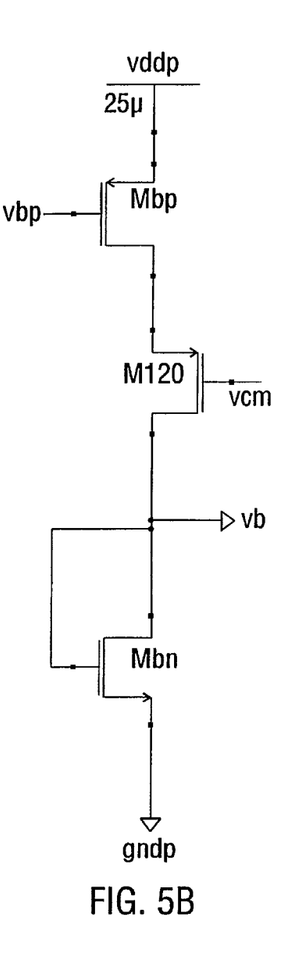
Figure 5C:
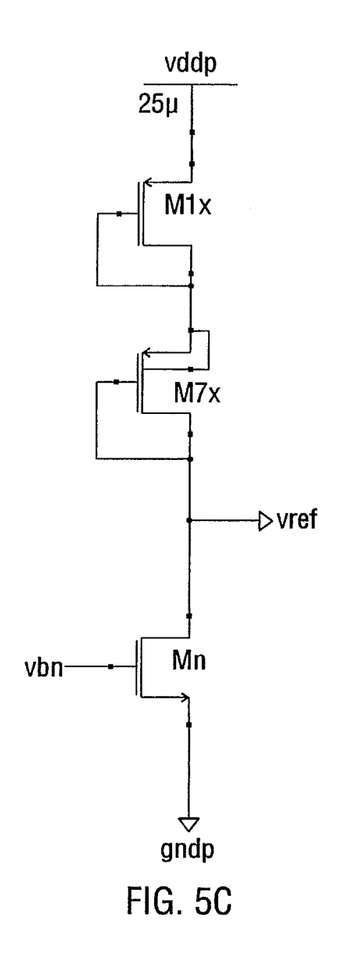

As shown in FIG. 4, the current through the folded branch of the amplifier is split through the current path of transistor M5 and the current path of transistor M6. The splicing of the current through the folded branch of the amplifier through M5 and M6 (with the aid of transistors M8 and M9) creates the two possible high impedance nodes, node 1 and node 2. The gate voltage of device M7 sets the gate voltage of the output device M1 to define the dc current through the output stage. In the following paragraphs, issues such as biasing, large signal and small signal analyses are presented. For the ease of explanation, all these analyses refer to the right half of the circuit as the circuit is symmetric.

a) Biasing:

The gates of transistors M8, M9 and Mtail are connected to bias gate voltage (vbp), which in turn is generated by sinking current through a PMOS device as shown in FIG. 5(a). This figure also shows the generation of the gate voltage (Vbn) of the NMOS devices Md and Mc. The bias voltage (vb) for the folding devices M5 and M6 is generated by sourcing current into the diode connected NMOS device Mbn as shown in FIG. 5(b). The devices M119 and M120 are added to decrease the voltage difference between the drain and source of mbiasp and mtp, and mbp. In dc conditions, the node 1 is set by the voltage on the gate of M7, vref. Vref results from a dc current that is sunk by device Mn through two cascaded diode connected PMOS devices as shown in FIG. 5(c). This dc current is chosen to be proportional to the current through M7 and is given by Ib=(current through M7)*(size of M7x)/(size of M7). Since M7x is designed to match M7, the voltage on node 1 will be the same as the voltage on the gate (drain) of M1x. Since M1x is designed to match M1, and their gate voltages are the same, the quiescent current through M1 is given by (current through M1 and M2)=Ib*M1/M1x. M7x is designed to match M7 and M1x is designed to match M1 in the amplifier. The other high impedance node, 2 is set by the global differential feedback through the external resistors to a voltage Vt+Vdsat above ground such that M2 sinks the same current as M1 sources (i.e. Ib*M1/M1x). This ensures that all devices are in saturation region of operation.

Figure 5D:
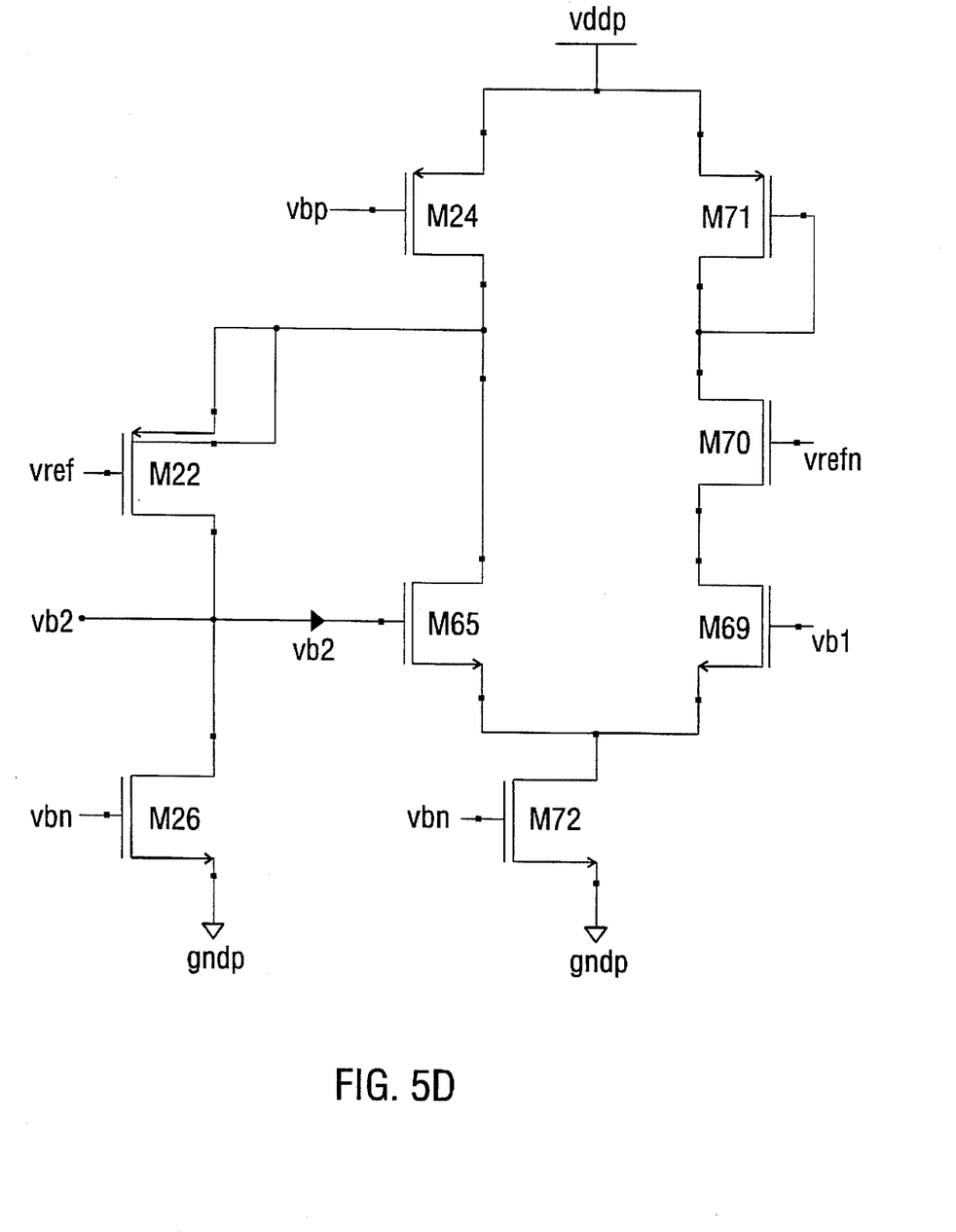
Figure 5E:
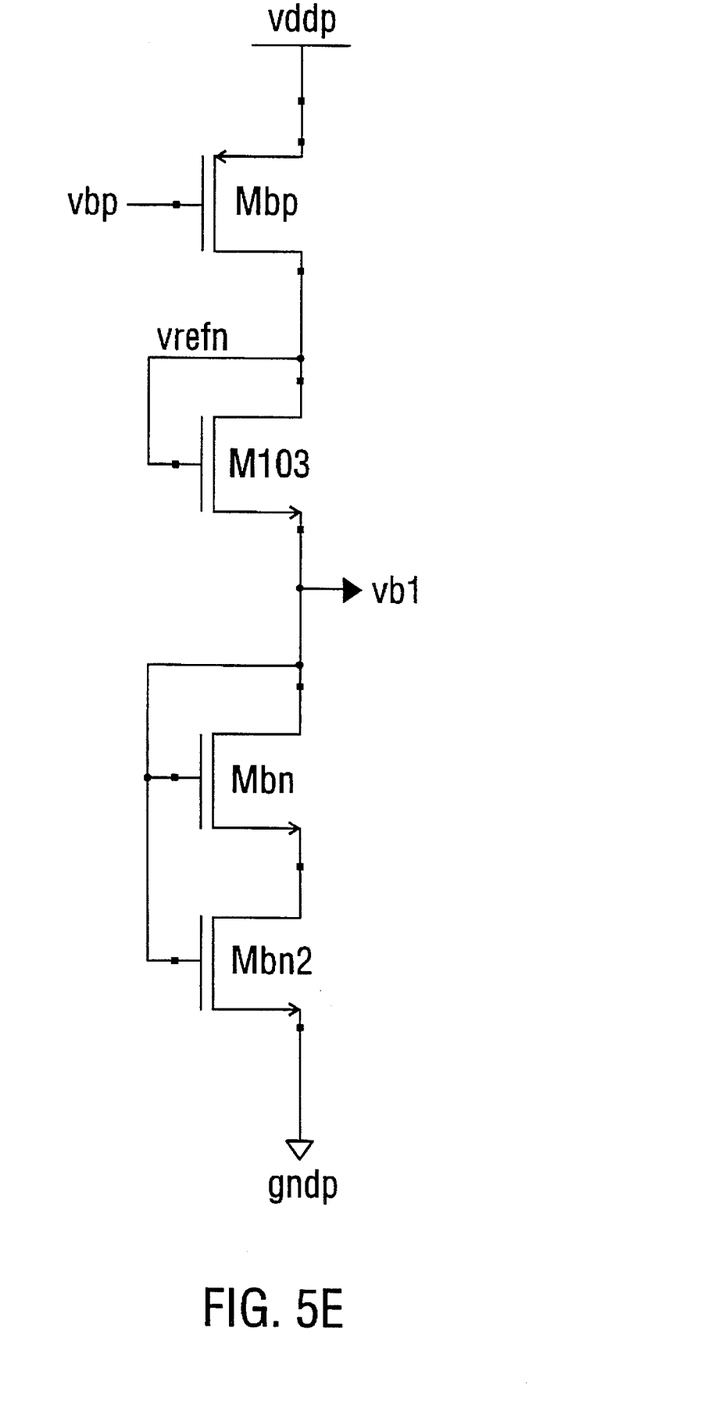
Figure 5F:
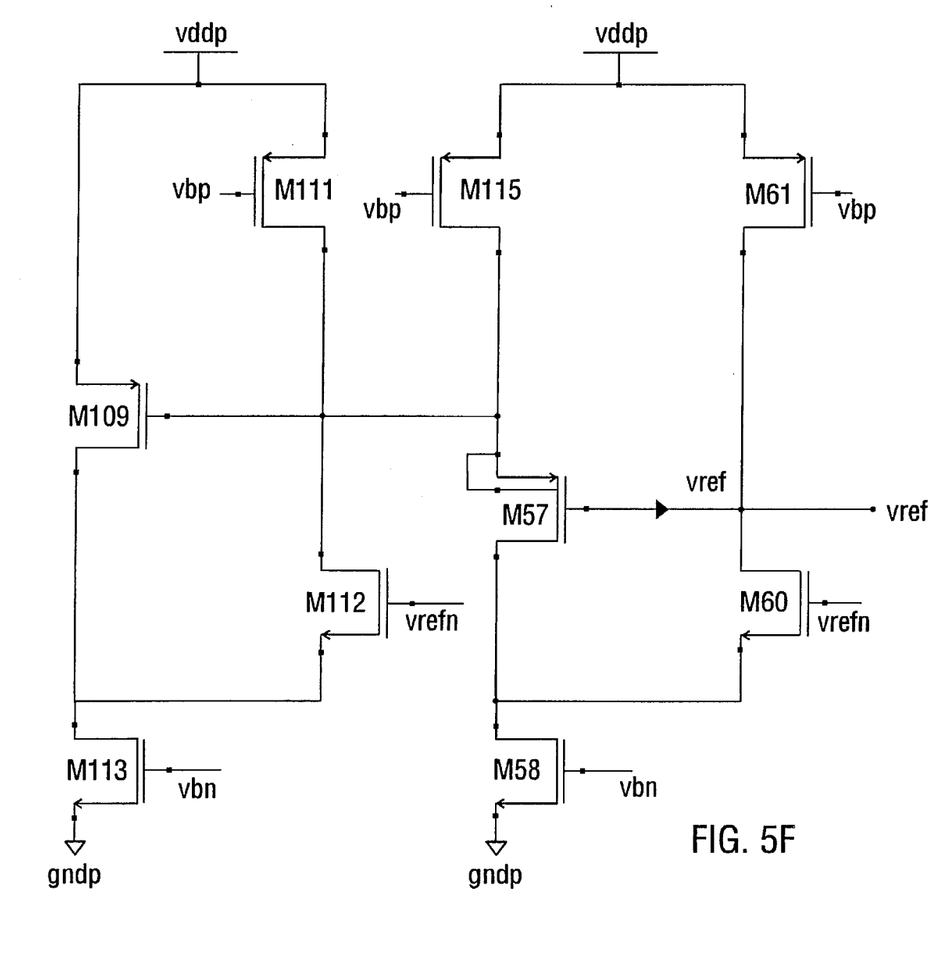

An alternative method for biasing the amplifier circuit of FIG. 4 may be seen with reference to FIG. 5(a), FIG. 5(d), FIG. 5(e) and FIG. 5(f). In this alternative method, the bias voltage vbp is generated with the circuit shown in FIG. 5(a). However, the bias voltages for transistors M5, M6, M5a and M6a is modified in that the gate drives of M5 and M6 and the gate drives of M5a and M6a are independent of each other. The gate of M5 and M5a are driven by vb1 and the gate of M6 and M6a are driven by vb2. FIG. 5(d) shows the circuitry for generating bias voltage vb2 for the transistors M6 and M6a while FIG. 5(e) shows the circuitry for generating the bias voltage vb1 for transistors M5 and M5a. The bias voltage for M7 and M7a, vref, is generated with the circuitry shown in FIG. 5(f).

The alternative bias scheme is particularly useful because a large number of applications require the amplifier circuit to operate at different supply voltages ranging from 2.7 volts to 5 volts. This wide range of power supply voltages can vary the quiescent current in the output devices by considerable amounts if the circuit is biased as shown in FIG. 5(a), FIG. 5(b), and FIG. 5(c). The negative feedback in the bias scheme of FIG. 5(a), FIG. 5(d), FIG. 5(e), and FIG. 5(f) allows variations in the vdd (and hence the vds of the output devices).

b) Large Signal Analysis:

When the output PMOS transistor M1 needs to be driven hard, Vin_N goes up. As node 1 comes down, transistor M7 cuts off providing a much higher impedance at node 1. When the PMOS transistor M1 is driven hard, the NMOS device M2 is designed to be cut off. It can be noted that when transistor M7 cuts off, transistor M5 goes into the linear region of operation. During this phase, since transistor M2 is cut off transistor M5 is not in the signal path and hence transistor M5's going into the linear region of operation does not cause problems. Thus the gate of the PMOS output device M1 can be driven to its maximum possible capability from Vdd−(Vt+Vdsat) to 2 Vdsat above ground. Since generally the Vdsat voltage is about 100 mv, the amplifier does not limit the drive significantly because this is the maximum possible drive for typical folded cascode structures.

During the other phase of the drive, NMOS transistor M2 needs to be driven hard. As seen from FIG. 4, the gate of the transistor M2 can be driven from a Vt+Vdsat above the ground to (Vdd−Vdsat) which is the maximum possible drive that can be provided by any amplifier. Unlike similar driver structures, this architecture does not contribute to the open loop nonlinearity as the paths to the output PMOS and NMOS devices M1 and M2 have similar gains. This ensures that no additional nonlinearity is added to the unavoidable nonlinearity due to the devices themselves and thus produces a reasonable sound quality.

c) Small Signal Analysis:

Small signal analysis on the right half of the circuit shows that the ac behavior of the circuit is dominated by three poles and a zero. The dominant pole is located at node 2. The presence of two signal paths to the output through the output NMOS (one path via M5 and one path via M6 and M7) gives rise to a pole zero doublet, the pole of which is located at the node 1 and the zero frequency is designed to be the same as that of this pole. The remaining high frequency pole is located at the node OUT_N. Under typical conditions, the crossover frequency is less than the non-dominant pole (at OUT_P), so a phase margin>45 degrees is obtained. However, under extreme process and temperature conditions, the circuit may need compensation. This is accomplished by adding a capacitor between the output node and the folding node similar to the compensation technique proposed by B. K. Ahuja in "An improved frequency compensation technique for omos operational amplifiers" IEEE JSSC. vol. 18 Dec. 1980. Thus a compensation capacitor may be added between OUT_N and the tied together sources of transistors M5 and M6.

It will be recognized that various modifications of the circuit shown in FIG. 4 may still utilize the present invention. For example, a resistance may be placed in series between the drain of transistor M5 and node 2. Preferably, this resistor would be a NMOS device. The added resistance delays the cut off of the output NMOS device (driven by node 2), until node 1 becomes a high impedance. This ensures that there is no low gain phase in the open loop characteristics of the driver (a low gain phase adds nonlinearity to the output waveform). Moreover, though typical currents are shown at various nodes in milliamps or microamps as labeled in FIG. 4, it will be recognized that such currents are shown for illustrative purposes and the present invention is not limited to the values of the currents shown in the figures, and in fact such design criteria may be changed and modified given a designer's specific needs.

Figure 6:
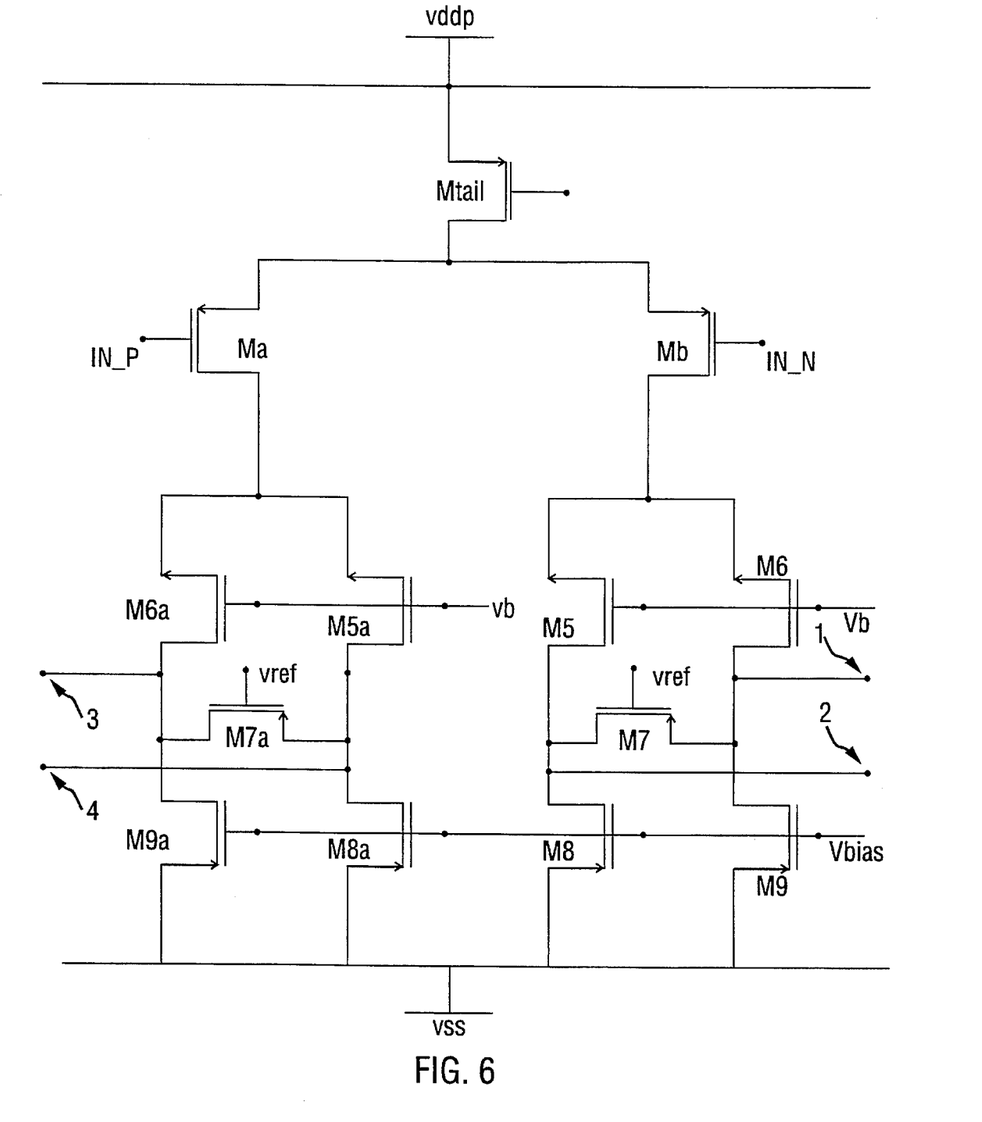
FIG. 6 illustrates an amplifier circuit similar to that shown in FIG. 4 except the current path is not folded.

The present invention is not limited to a folded cascode amplifier. FIG. 6 illustrates an amplifier design similar to that of FIG. 4 except the current paths are not folded. In FIG. 6 the amplifier still utilizes dual transconductance current paths. The particular type of dual transconductance current path in this circuit is also a split transconductance current path. Thus, as shown in FIG. 6, the current path may be split from transistor Mb through transistors M5 and M6; however, this current path is not a folded path to Vdd. The present invention is still utilized, though, because transistor M7 still is connected between node 1 and node 2. Transistor M7 in FIG. 6 operates similar to transistor M7 in FIG. 4 in that it provides a transistor between the dual current paths such that at any given time one path provides a high impedance gain to one of the output devices while the other path provides a low impedance gain to the other output device. As shown in FIG. 6, the amplifier has impedance nodes 1–4. These nodes may be connected to the gates of output devices similar to the circuitry of FIG. 4.

Figure 7:
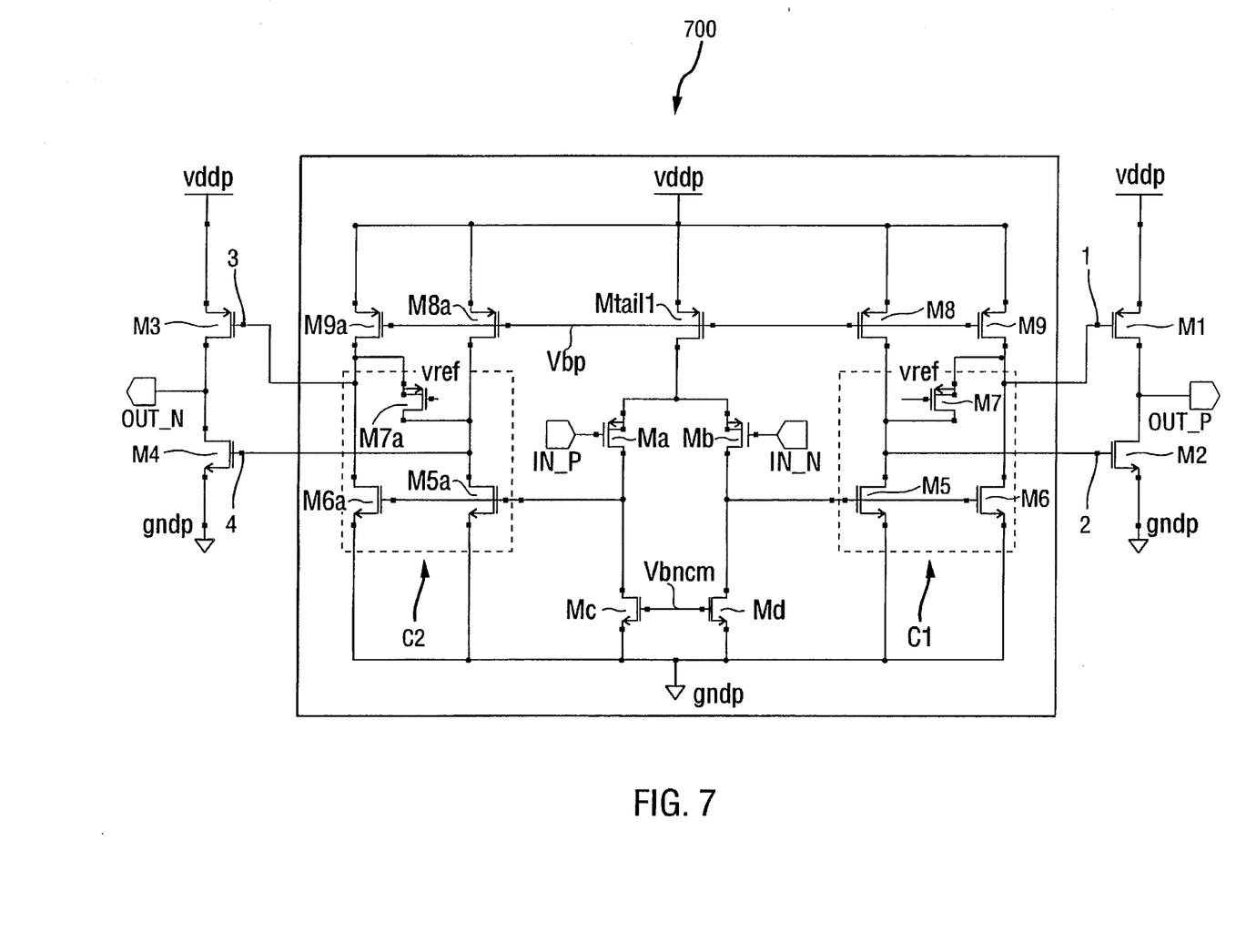
FIG. 7 illustrates another amplifier design utilizing the present invention.

FIG. 7 illustrates yet another amplifier design implementing the present invention. In FIG. 7, an amplifier 700 is shown that is similar to the amplifier 400 shown in FIG. 4. However, amplifier 700 implements the present invention without a folded cascode amplifier as the basic gain stage. Thus, this circuit has an additional inversion and a low frequency pole. As shown in FIG. 7, the amplifier 700 differs from the amplifier 400 of FIG. 4 in that the gates of transistors M5 and M6 are controlled by the common drain node between transistors Mb and Md. Likewise, the gates of transistors M5a and M6a are controlled by the common drain node between transistors Ma and Mc. In amplifier 700, the sources of transistors M5a, M6, and M6a are all tied to ground. In FIG. 7 dual transconductance current paths are also utilized, one current branch being through transistor M5 and one current branch being through transistor M6. The dual transconductance current paths in this case are not split transconductance paths. However, the present invention is still utilized by connecting transistor M7 between nodes 1 and 2. Thus, FIG. 7 illustrates yet another amplifier design utilizing a dual transconductance stages between which a transistor is connected to aid in driving the nodes of each transconductance stage to their desired impedance state.

Further modifications and alternative embodiments of this invention will be apparent to those skilled in the art in view of this description. For example, the use of N-channel and P-channel devices shown herein are generally the preferred arrangement of device types, however, it will be recognized that tile present invention is not so limited. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements or materials may be substituted for those illustrated and described herein, and certain features of the invention may be utilized independently of the use of other features, all as would be apparent to one skilled in the art after having the benefit of this description of the invention.

What is claimed is:

1. An integrated circuit amplifier circuit, comprising:

a pair of differential input transistors, said pair including a first input transistor and a second input transistor;

a first dual transconductance current path connected to said first input transistor, said first dual transconductance current path having at least first and second transconductance current paths;

a third transistor, a drain of said third transistor connected to said first transconductance current path and a source of said third transistor connected to said second transconductance current path; and a first output stage driven in class AB mode coupled to said drain and said source.

2. The amplifier circuit of claim 1, current in said first dual transconductance current path being split from current through said first input transistor.

3. The amplifier circuit of claim 1, current in said first dual transconductance current path being generated by a voltage generated from current through said first input transistor.

4. The amplifier circuit of claim 1, said output stage further comprising a first output transistor and a second output transistor, said first output transistor coupled to said first transconductance current path and said second output transistor coupled to said second transconductance current path.

5. The amplifier circuit of claim 4, a gate of said first output transistor connected to a first node, said first node within said first transconductance path and a gate of said second output transistor connected to a second node, said second node within said second transconductance path.

6. The amplifier circuit of claim 5, said first and second nodes each capable of being at a high impedance state or low impedance state depending upon the operation conditions of said amplifier, said third transistor aiding in driving said first and second nodes to their respective impedance states.

7. The amplifier circuit of claim 1, said first and second transconductance current paths connected to said first input transistor such that at least a portion of a current through said first input transistor is split through said first and second transconductance current paths.

8. The amplifier circuit of claim 7, said amplifier circuit having a folded cascode amplifier, said third transistors connected between two folded current paths of said folded cascode amplifier.

9. The amplifier circuit of claim 1, further comprising:

a second dual transconductance current path, said second dual transconductance current path having third and fourth transconductance current paths, said third and fourth transconductance current paths connected to said second input transistor;

a fourth transistor, a drain of said fourth transistor connected to said third transconductance current path and a source of said fourth transistor connected to said fourth transconductance current path;

said first output stage connected to said first transconductance current path and said second transconductance current path, said first output stage comprising, a first output node; and a first output transistor and a second output transistor, a gate of said first output transistor connected to a first node, said first node within said first transconductance path, and a gate of said second output transistor connected to a second node, said second node within said second transconductance path; and a second output stage driven in class AB mode connected to said third transconductance current path and said fourth transconductance current path, said second output stage comprising, a second output node; and a third output transistor and a fourth output transistor, a gate of said third output transistor connected to a third node, said third node within said third transconductance path, and a gate of said fourth output transistor connected to a fourth node, said fourth node within said fourth transconductance path.

10. The amplifier circuit of claim 9, said first and second nodes each capable of being at a high impedance state or low impedance state depending upon the operation conditions of said amplifier, said third transistor aiding in driving said first and second output nodes to their respective impedance states; and said third and fourth nodes each capable of being at a high impedance state or low impedance state depending upon the operation conditions of said amplifier, said fourth transistor aiding in driving said third and fourth output nodes to their respective impedance states.

11. An integrated circuit amplifier comprising:

first and second input nodes for receiving a plurality of input voltages;

a first dual transconductance current path having at least a first and second current branch, current in said first dual transconductance current path indicative of said plurality of input voltages;

a first voltage node within said first current branch and a second voltage node within said second current branch, each of said first and second voltage nodes capable of being a high impedance state or low impedance state depending upon the operation conditions of said amplifier;

a transistor having a source connected to said first voltage node and a drain connected to second voltage node, said transistor aiding in driving said first and second output nodes to their respective desired impedance state; and a first output stage driven in class AB mode coupled to said first voltage node and said second voltage node.

12. The amplifier circuit of claim 11, current in said first dual transconductance current path being split from an input current path through a first input transistor, said first input node connected to a gate of said first input transistor.

13. The amplifier circuit of claim 11, current in said first dual transconductance current path being generated by a voltage generated from current through a first input transistor, said first input node connected to a gate of said first input transistor.

14. The amplifier circuit of claim 11, said first output stage comprising:

first and second output transistors, said output transistors having a common node, said common node being an output node of said amplifier circuit, wherein a gate of said first output transistor is controlled by the voltage at said first voltage node and a gate of said second output transistor is controlled by the voltage at said second voltage node.

15. The amplifier circuit of claim 12, said amplifier circuit being a folded cascode amplifier.

16. The amplifier circuit of claim 15, said first output stage comprising:

first and second output transistors, said output transistors having a common node, said common node being an output node of said amplifier circuit, wherein a gate of said first output transistor is controlled by the voltage at said first voltage node and a gate of said second output transistor is controlled by the voltage at said second voltage node.

17. The amplifier circuit of claim 16, said amplifier circuit further comprising a second dual transconductance current path symmetrical to said first dual transconductance current path, third and fourth voltage nodes symmetrical to said first and second voltage nodes, and a second output stage symmetrical to said first output stage.

18. A folded cascode class AB amplifier circuit, comprising:

first and second input transistors having common sources, a gate of each input transistor connected to an input node of said amplifier;

a current source connected to a voltage supply, said current source supplying current to said common sources of said input transistors;

a first split transconductance current path connected to a drain of said first input transistor, said first split transconductance current path having a first and second current branch, said first current branch comprising, at least two first current branch transistors having common drains and connected in series between said voltage supply and a drain of said first input transistor, said common drains of said first current branch transistors being a first node, said second current branch comprising, at least two second current branch transistors having a common drain and connected in series between said voltage supply and said drain of said first input transistor, said common drains of said second current branch transistors being a second node, each of said first and second nodes capable of being a high impedance state or a low impedance state depending upon the operating conditions of said amplifier;

a transistor having a source connected to said first node and a drain connected to second node, said transistor aiding in driving said first and second output nodes to their respective desired impedance state.

19. The amplifier of claim 18 further comprising a first output stage, said first output stage comprising, an output node; and first and second output transistors having common drains, a gate of said first output transistor connected to said first node, and a gate of said second output transistor connected to said second node, said output node connected to said common drains of said first and second output transistors.

20. The amplifier of claim 19 further comprising:

a second split transconductance current path connected to said second input transistor, said second split transconductance current path being symmetrical to said first split transconductance current path; and a second output stage connected to said second split transconductance current path, said second output stage being symmetrical to said first output stage.

* * * * *